United States Patent
Gassend et al.

(10) Patent No.: US 10,256,605 B2
(45) Date of Patent: Apr. 9, 2019

(54) GANFET AS ENERGY STORE FOR FAST LASER PULSER

(71) Applicant: Waymo LLC, Mountain View, CA (US)

(72) Inventors: Blaise Gassend, East Palo Alto, CA (US); Pierre-Yves Droz, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 15/826,630

(22) Filed: Nov. 29, 2017

(65) Prior Publication Data
US 2018/0109074 A1    Apr. 19, 2018

Related U.S. Application Data

(63) Continuation-in-part of application No. 15/294,172, filed on Oct. 14, 2016, now abandoned.

(51) Int. Cl.
| | |
|---|---|
| H01S 5/042 | (2006.01) |
| H01S 5/068 | (2006.01) |
| H01S 5/0625 | (2006.01) |

(52) U.S. Cl.
CPC ........ H01S 5/0428 (2013.01); H01S 5/06817 (2013.01); H01S 5/06253 (2013.01)

(58) Field of Classification Search
CPC ..... H01S 5/0428; H01S 5/042; H01L 29/778; H01L 29/1608; H01L 29/2003
See application file for complete search history.

(56) References Cited

U.S. PATENT DOCUMENTS

| | | | |
|---|---|---|---|
| 3,942,160 | A | 3/1976 | Yu |
| 4,648,093 | A | 3/1987 | Sasnett et al. |
| 4,998,052 | A | 3/1991 | Erdman et al. |
| 5,895,984 | A | 4/1999 | Renz |

(Continued)

FOREIGN PATENT DOCUMENTS

| | | |
|---|---|---|
| JP | 56-24990 A | 3/1981 |
| JP | 5334189 B2 | 11/2013 |
| WO | 2012/070283 A1 | 5/2012 |

OTHER PUBLICATIONS

Written Opnion, International Application No. PCT/US2017/056492, dated Jan. 17, 2018.

(Continued)

*Primary Examiner* — Xinning Niu
(74) *Attorney, Agent, or Firm* — McDonnell Boehnen Hulbert & Berghoff LLP

(57) ABSTRACT

The present disclosure relates to systems and circuits that may facilitate sub-5 nanosecond laser diode operation. An example system includes a trigger source, a laser diode, a first field effect transistor and a second field effect transistor. The laser diode is coupled to a supply voltage and a drain terminal of the first field effect transistor. A source terminal of the first field effect transistor is coupled to ground and a gate terminal of the first field effect transistor is coupled to the trigger source. A drain terminal of the second field effect transistor is coupled to the supply voltage. A source terminal of the second field effect transistor and a gate terminal of the second field effect transistor are coupled to ground. In an example embodiment, the first field effect transistor and the second field effect transistor comprise gallium nitride (GaN).

20 Claims, 5 Drawing Sheets

(56) References Cited

U.S. PATENT DOCUMENTS

| | | |
|---|---|---|
| 6,861,828 B2 | 3/2005 | Watanabe |
| 6,873,203 B1 | 3/2005 | Latham, II et al. |
| 7,184,130 B1 | 2/2007 | Barr |
| 7,802,464 B2 | 9/2010 | Tobias |
| 7,969,558 B2 | 6/2011 | Hall |
| 7,977,926 B2 | 7/2011 | Williams |
| 8,115,913 B2 | 2/2012 | Komamaki |
| 8,981,673 B2 | 3/2015 | Athalye |
| 9,214,783 B2 | 12/2015 | Nomura et al. |
| 9,368,936 B1 | 6/2016 | Lenius et al. |
| 2007/0280314 A1 | 12/2007 | Keh et al. |
| 2010/0254713 A1 | 10/2010 | Tanaka |
| 2010/0258945 A1 | 10/2010 | Numata et al. |
| 2012/0057260 A1 | 3/2012 | Poulton |
| 2013/0069551 A1 | 3/2013 | Kitamura et al. |
| 2014/0184306 A1 | 7/2014 | Zundel et al. |
| 2015/0005612 A1 | 1/2015 | Suzuki |
| 2015/0188534 A1 | 7/2015 | Yonezawa et al. |
| 2015/0372587 A1 | 12/2015 | Imada et al. |
| 2016/0079979 A1 | 3/2016 | Kinzer et al. |
| 2017/0085057 A1 | 3/2017 | Barnes et al. |

OTHER PUBLICATIONS

Liero, Armin et al. "Laser driver switching 20 A with 2 ns pulse width using GAN" IMS (2010), pp. 1110-1113.

Liero et al., "Laser Driver Switching 20 A with 2 ns Pulse Width Using GaN", IEEE, 2010, 1110-1113.

Lidow et al., "GaN Transistors for Efficient Power Conversion (First Edition)", The eGaN FET Journey Continues, Power Conversion Publications, 2012, 43 pages (cover, title, table of contents, chapters 1, 3 and 14).

Printed webpage https://www.amazon.com/GaN-Transistors-Efficient-Power-Conversion/dp/0615569250, printed on Aug. 29, 2017, 6 pages.

Lumped Circuit
Diagram

Voltage across Laser Diode versus Time

GANFET AS ENERGY STORE FOR FAST LASER PULSER

CROSS-REFERENCE TO RELATED APPLICATION

This application is a Continuation-in-part of U.S. patent application Ser. No. 15/294,172, filed Oct. 14, 2016, which is incorporated herein by reference in its entirety.

BACKGROUND

Unless otherwise indicated herein, the materials described in this section are not prior art to the claims in this application and are not admitted to be prior art by inclusion in this section.

Conventional laser driver circuits may provide signals (e.g., specific currents and/or voltages) to a laser light-emitting device (e.g., a laser diode). In turn, the laser light-emitting device may emit constant or pulsed laser light. However, operating conventional laser driver circuits with short pulse lengths and/or at high frequency or repetition rates may produce ringing, instability, or other unwanted effects.

For example, in a conventional laser pulser circuit, ringing may be a result of an LC tank formed by a parasitic inductance, a fixed capacitor, and a parasitic capacitance of the switching field effect transistor. Increasing the value of the fixed capacitor may reduce the ringing, but pulse recovery may also be slower.

SUMMARY

The present disclosure generally relates to laser systems and laser driver circuits configured to provide pulses of laser light.

In a first aspect, a system is provided. The system includes a trigger source, a laser diode, a first field effect transistor, and a second field effect transistor. The laser diode is coupled to a supply voltage and a drain terminal of the first field effect transistor. A source terminal of the first field effect transistor is coupled to ground. A gate terminal of the first field effect transistor is coupled to the trigger source. A drain terminal of the second field effect transistor is coupled to the supply voltage. A source terminal of the second field effect transistor and a gate terminal of the second field effect transistor are coupled to ground.

In a second aspect, a circuit is provided. The circuit includes a laser diode, a first field effect transistor, and a second field effect transistor. The laser diode is coupled to a supply voltage and a drain terminal of the first field effect transistor. A source terminal of the first field effect transistor is coupled to ground. A drain terminal of the second field effect transistor is coupled to the supply voltage. A source terminal of the second field effect transistor and a gate terminal of the second field effect transistor are coupled to ground.

Other aspects, embodiments, and implementations will become apparent to those of ordinary skill in the art by reading the following detailed description, with reference where appropriate to the accompanying drawings.

DETAILED DESCRIPTION

Figure 1:
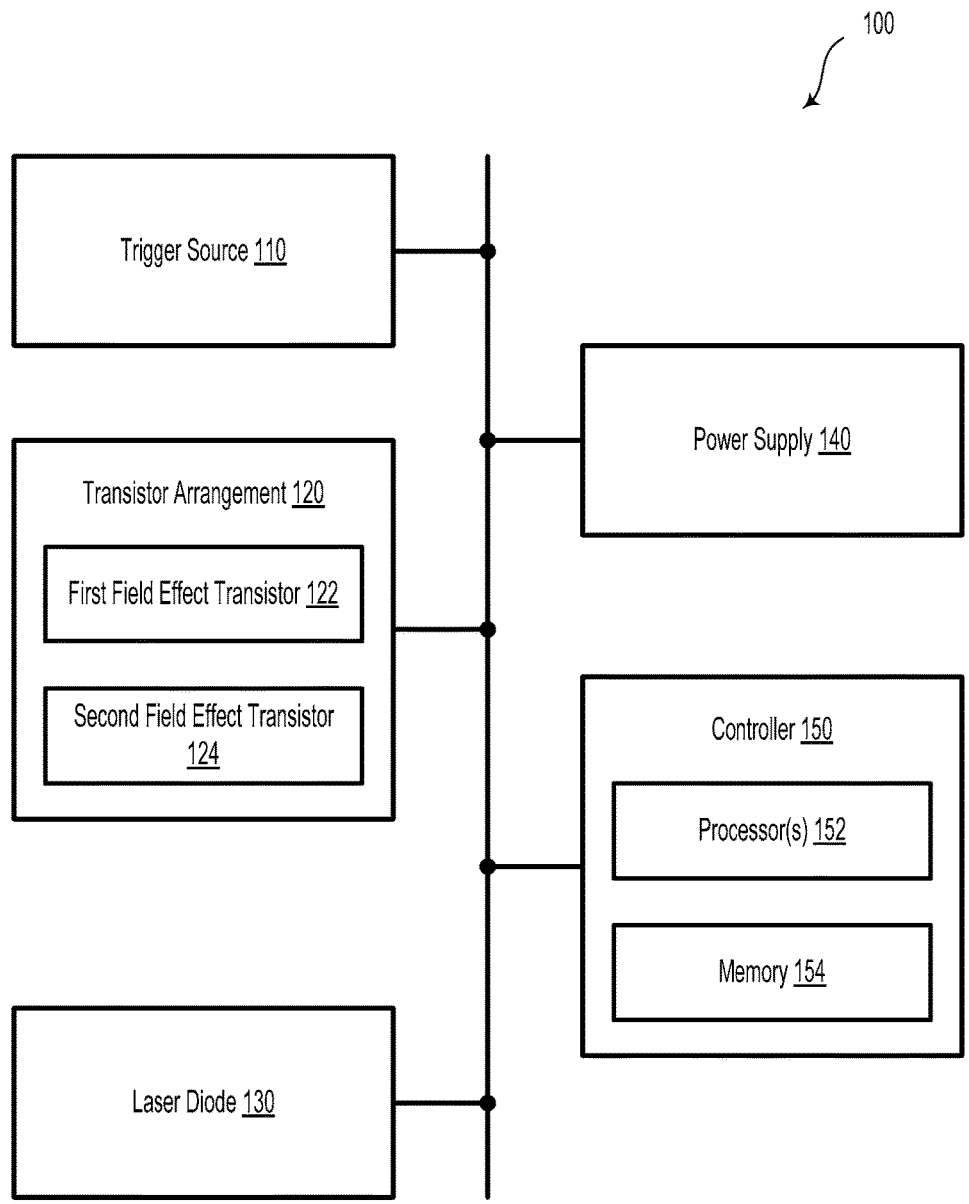
FIG. 1 illustrates a system, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

A laser pulser circuit may include a laser diode coupled to a supply voltage and a drain terminal of a first field effect transistor (FET). The source terminal of the first FET is coupled to ground. A gate terminal of the first FET may be coupled to a waveform generator or another type of trigger source. The laser pulser circuit may also include a second FET whose drain terminal is connected to the supply voltage and whose source terminal and gate terminal is connected to the ground.

In an example embodiment, the laser diode may be configured to provide laser light over very short pulse lengths, e.g., 2 nanoseconds. In some embodiments, the first and second FETs may include GaN (e.g., GaNFET) or SiC (e.g., SiCFET). Other types of high-voltage (100+ volts) fast-switching transistors are contemplated. For example, the FETs may be configured for use in microwave applications. In some embodiments, the FETs may be flip-chip or surface-mount devices.

The second FET may reduce oscillations (e.g., ringing) that may occur at such short pulse lengths due to parasitic inductance and capacitance in the laser pulser circuit. Furthermore, the second FET may reduce or eliminate the development of a negative voltage between supply voltage and ground common in other RLC circuit designs.

In an example embodiment, a body diode may be formed by a p-n junction that connects the source and drain terminals of the second FET. In other words, the body diode may act as a very fast parallel shunt diode, which may provide a path for reverse drain current (e.g., free-wheeling current) under some operating conditions of the laser pulser circuit. Furthermore, under some operating conditions, the second FET may act as a capacitor with capacitance that scales inversely with bias. For example, with a GaNFET, the capacitance of the transistor may be higher after a pulse compared to the capacitance while energy is being discharged through the laser diode.

II. Example Systems

FIG. 1 illustrates a schematic diagram of system 100, according to an example embodiment. System 100 includes a trigger source 110, a transistor arrangement 120, a laser diode 130, and a power supply 140. In some embodiments, system 100 may include an optional controller 150.

The trigger source 110 may include a waveform generator, a pulse signal generator, or another type of device configured to provide a trigger pulse or trigger signal.

The laser diode 130 is coupled to a supply voltage, which may be provided, at least in part, by the power supply 140. In an example embodiment, the supply voltage may be greater than 100 volts. However, other values for the supply voltage are possible.

The transistor arrangement 120 includes a first FET 122 and a second FET 124. In an example embodiment, the first FET 122 and the second FET 124 could be NMOS, enhancement-mode, surface mount transistors. In such a scenario, the laser diode 130 may be coupled to a drain terminal of the first FET 122. A source terminal of the first FET 122 is coupled to a ground terminal. A gate terminal of the first FET 122 is coupled to the trigger source 110.

A drain terminal of the second FET 124 is coupled to the supply voltage (e.g., power supply 140). A source terminal of the second FET 124 and a gate terminal of the second FET 124 are coupled to ground.

The controller 150 may include at least one processor and a memory. In such a scenario, the at least one processor may execute instructions stored in the memory so as to carry out various operations described herein. As an example, the controller 150 may cause system 100 to produce laser light via one or more laser pulses.

In an example embodiment, the controller 150 may cause the trigger source 110 to provide a trigger pulse signal so as to cause the laser diode 130 to emit a laser pulse. That is, the controller 150 may be configured to trigger, adjust, and/or control the emission of laser light from the laser diode 130.

In some embodiments, the laser pulse or pulses may include a pulse width of less than 2.5 nanoseconds. However, other pulse widths are possible and contemplated herein.

In an example embodiment, the first FET 122 and the second FET 124 may include gallium nitride (GaN). That is, in such examples, the first FET 122 and the second FET 124 may be GaNFET devices.

Additionally or alternatively, the first FET 122 and the second FET 124 may include silicon carbide (SiC). That is, the first FET 122 and the second FET 124 could be SiCFET devices.

Yet further, the first FET 122 and/or the second FET 124 may include a high electron mobility transistor (HEMT).

The first FET 122 and/or the second FET 124 could be in the form of a surface-mount device. However, other form factors for the first FET 122 and/or the second FET 124 are contemplated.

In some embodiments, the second FET 124 may be configured to reduce oscillations in the system. In particular, the second FET 124 may be configured to reduce or eliminate a negative voltage between a drain terminal and a source terminal of the first FET 122. In an example embodiment, under some operating conditions of the system 100, the second FET 124 may include a body diode, which may be formed by a p-n junction that connects the drain and drain terminals of the second FET. As such, the body diode may act as a parallel shunt diode, which may provide a path for reverse drain current (e.g., free-wheeling current). As described elsewhere herein, the second FET may act as a capacitor having a capacitance that scales inversely with bias. For example, a GaNFET may include a capacitance that is higher after a pulse compared to the capacitance while energy is being discharged through the laser diode 130.

In one embodiment, system 100 may include a return diode connected between the drain terminal of the first FET 122 and the supply voltage 140.

It is to be understood that other arrangements of the elements of system 100 are possible and contemplated herein. Specifically, while embodiments herein may relate to enhancement-mode NMOS FETs, one of ordinary skill in the art would understand that many other variations of circuit 200 are possible to provide a fast switching capability and/or provide sub-2.5 nanosecond laser light pulse widths. For example, the system 100 could be modified to accommodate the first FET 122 and/or the second FET 124 as being PMOS-type and/or depletion mode FETs. All such variations are contemplated within the scope of the present disclosure.

The controller 150 may include one or more processors 152 and a memory 154. The one or more processors 152 may be a general-purpose processor or a special-purpose processor (e.g., digital signal processors, application specific integrated circuits, etc.). The one or more processors 152 may be configured to execute computer-readable program instructions that are stored in the memory 154. As such, the one or more processors 152 may execute the program instructions to provide at least some of the functionality and operations described herein.

The memory 154 may include or take the form of one or more computer-readable storage media that may be read or accessed by the one or more processors 152. The one or more computer-readable storage media can include volatile and/or non-volatile storage components, such as optical, magnetic, organic or other memory or disc storage, which may be integrated in whole or in part with at least one of the one or more processors 152. In some embodiments, the memory 154 may be implemented using a single physical device (e.g., one optical, magnetic, organic or other memory or disc storage unit), while in other embodiments, the memory 154 can be implemented using two or more physical devices.

As noted, the memory 154 may include computer-readable program instructions that relate to operations of system 100. As such, the memory 154 may include program instructions to perform or facilitate some or all of the functionality described herein.

III. Example Circuits

Figure 2A:
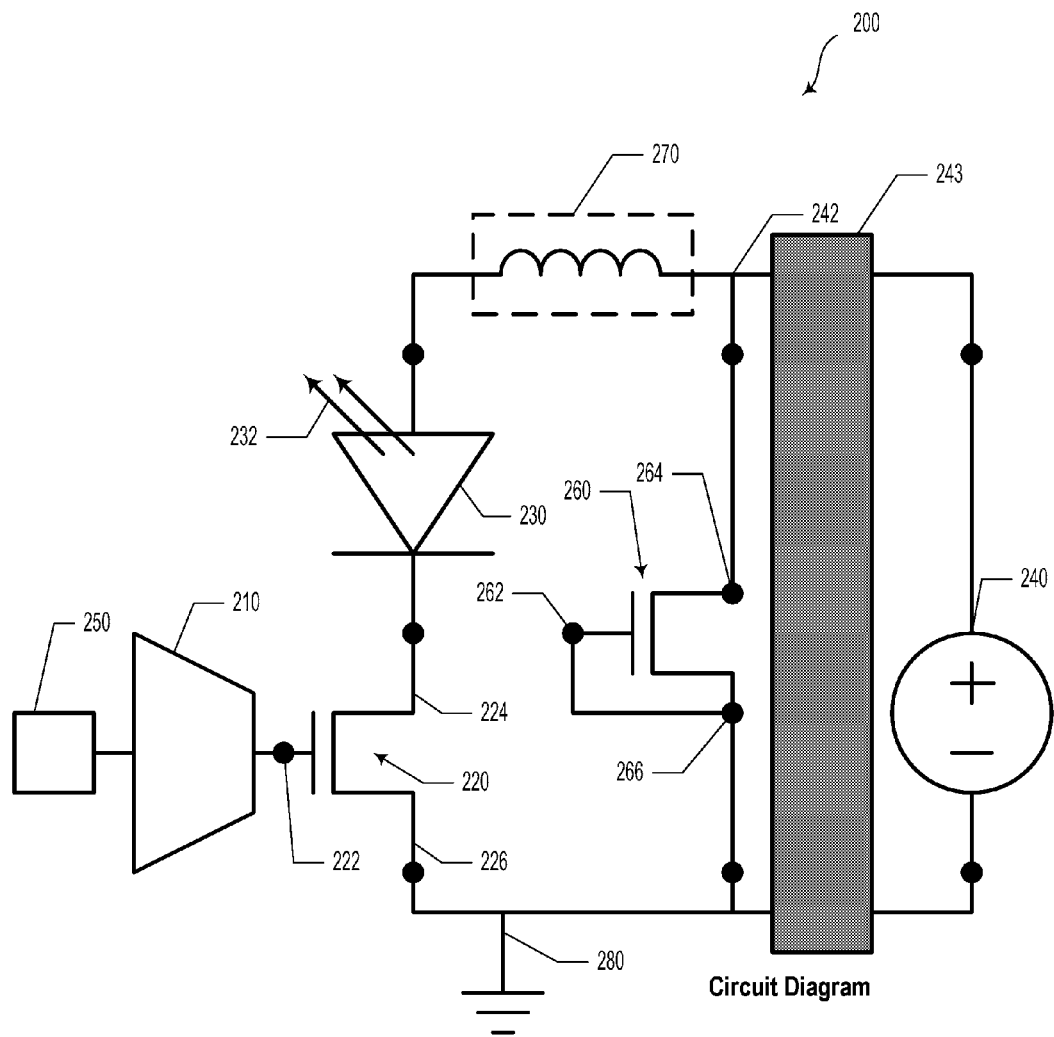
FIG. 2A illustrates a circuit, according to an example embodiment.

FIG. 2A illustrates a circuit 200, according to an example embodiment. Circuit 200 may be similar or identical to system 100 as illustrated and described with regard to FIG. 1. Some or all of the elements of circuit 200 may be similar or identical to corresponding elements of system 100.

Circuit 200 includes a laser diode 230, a first FET 230, and a second FET 260. The circuit 200 may also include a voltage source 240, a trigger source 210, and a controller 250.

In an example embodiment, the laser diode 230 is coupled to a supply voltage 242, which may be provided, at least in part, by the voltage source 240. The laser diode 230 is also coupled to a drain terminal 224 of the first FET 220. A source terminal 226 of the first FET 220 is coupled to a ground terminal 280. In some embodiments, the supply voltage may be greater than 100 volts.

Furthermore, a drain terminal 264 of the second FET 260 is coupled to the supply voltage 242. A source terminal 266 and a gate terminal 262 of the second FET 260 are coupled to ground terminal 280. As a result, source terminal 266, gate terminal 262, and ground terminal 280 are all at substantially the same voltage.

Without the second FET 260, at short pulse widths (e.g., less than 5 ns) and/or high repetition rates, a parasitic inductance 270 may provide undesirable circuit behavior such as ringing or other effects. However, by coupling the source terminal 266 and the gate terminal 262 to ground, the second FET 260 may operate as a fixed or variable capacitor. The capacitance value of the second FET 260 may provide compensation for the parasitic inductance 270.

In some embodiments, a gate terminal 222 of the first FET 220 may be coupled to the trigger source 210. In such a scenario, the trigger source 210 may be coupled to the controller 250. The trigger source 210 may be a signal generator, such as a Tektronix 3390 Arbitrary Waveform Generator. However, the trigger source 210 could additionally or alternatively be any other device or custom circuit (e.g., an Application-Specific Integrated Circuit, ASIC or Field-Programmable Gate Array, FPGA) configured to provide a continuous or pulsed voltage signal to gate 222. As an example, the trigger source 210 may include a Peregrine Semiconductor PE29100 high-speed FET driver.

In an example embodiment, the first FET 220 may be an NMOS enhancement mode FET. That is, when the trigger source 210 provides a signal such that a "high" gate-source voltage (e.g., a voltage between the gate 222 and the drain 226) is greater than zero, the first FET 220 may substantially operate as being "ON" or like a closed switch. When the trigger source 210 provides a "low" gate-source voltage (e.g., zero volts between the gate 222 and the drain 226), the first FET 220 may operate as being "OFF" or like an open switch.

In such a scenario, the trigger source 210 may be operable to provide a trigger pulse to gate 222, turning the first FET 220 "ON" and causing the laser diode 230 to emit a laser light pulse 232. In an example embodiment, the laser light pulse 232 may have a pulse width of less than 2.5 nanoseconds. Furthermore, the trigger source 210 may be operable to provide a pulse train of trigger pulses so as to cause the laser diode 230 to emit a laser pulse train of laser light pulses 232, each laser pulse of the pulse train having a pulse width of less than 2.5 nanoseconds.

One of ordinary skill in the art would understand that many other variations of circuit 200 are possible to provide a fast switching capability and/or provide sub-2.5 nanosecond laser light pulse widths. For example, the circuit 200 could be modified to accommodate the first FET 220 and/or the second FET 260 as being PMOS-type and/or depletion mode FETs. All such variations are contemplated within the scope of the present disclosure. It will be understood that other circuitry 243 may be included in circuit 200. In such scenarios, other circuitry 243 could include, for example, circuitry that may operate over a slower time scale than that of the second FET 260 and/or the laser diode 230.

Optionally, at least one of the first FET 220 or the second FET 260 may be a high electron mobility transistor (HEMT). Namely, the HEMT could include a semiconductor heterostructure (e.g., GaAs/AlGaAs, AlGaN/AlN/GaN, etc.). Additionally or alternatively, the first FET 220 or the second FET 260 may be a high-speed high-power transistor. Furthermore, as described elsewhere herein, the first FET 220 and/or the second FET 260 could include GaN, such as an Efficient Power Conversion Corporation EPC2010C NMOS surface mount GaN enhancement mode power transistor. Additionally or alternatively, the first FET 220 and/or the second FET 260 could include SiC. For example, the first FET 220 and/or the second FET 260 could be a Wolfspeed/Cree C3M0120090J-TR SiC N-channel surface mount FET. Other FET device types and materials are contemplated herein.

Figure 2B:
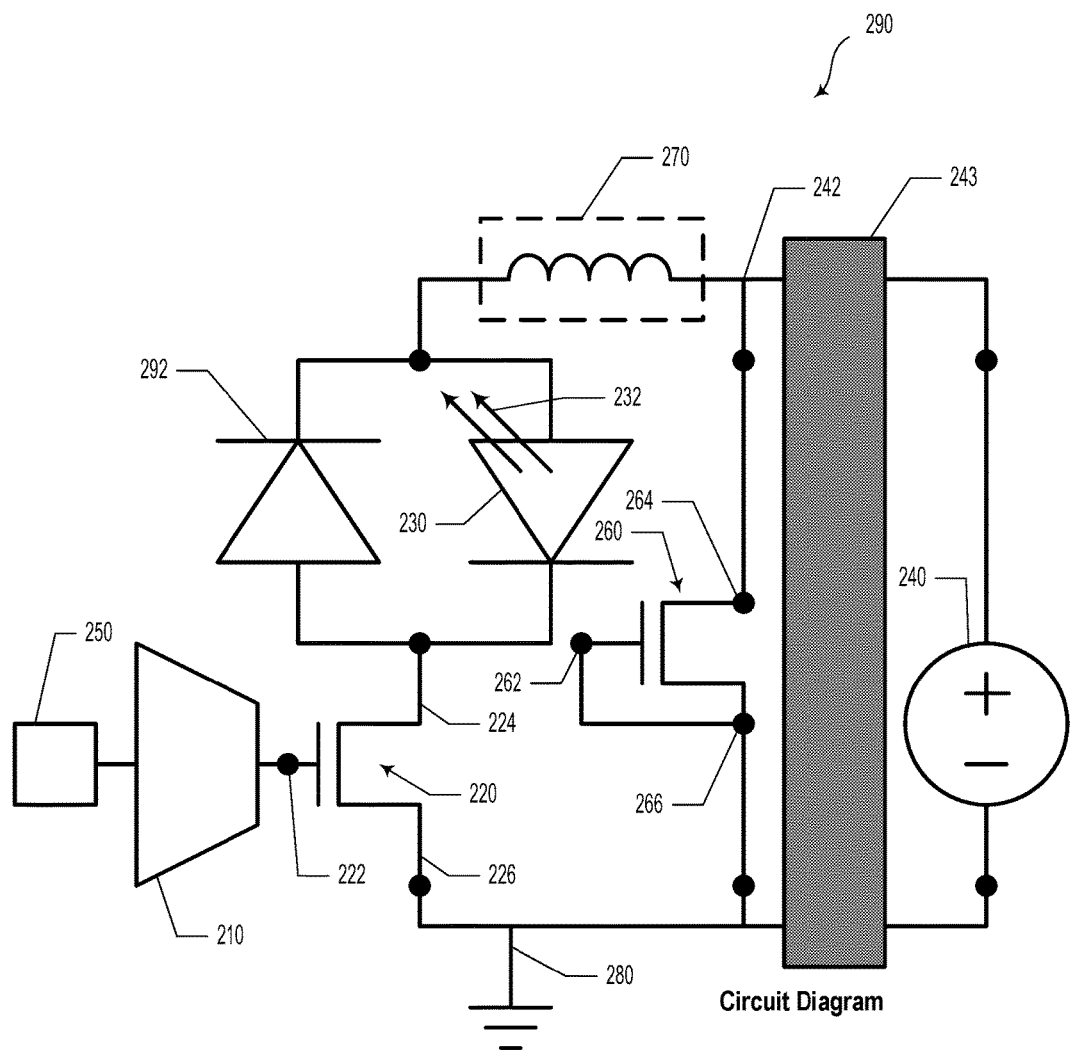
FIG. 2B illustrates a circuit, according to an example embodiment.

FIG. 2B illustrates a circuit 290, according to an example embodiment. The elements of circuit 290 may be similar or identical to corresponding elements of circuit 200, as illustrated and described with regard to FIG. 2A. Circuit 290 may include a return diode 292 that could be a semiconductor diode device, such as a Central Semiconductor CMPD914TR surface mount switching diode.

Figure 3:
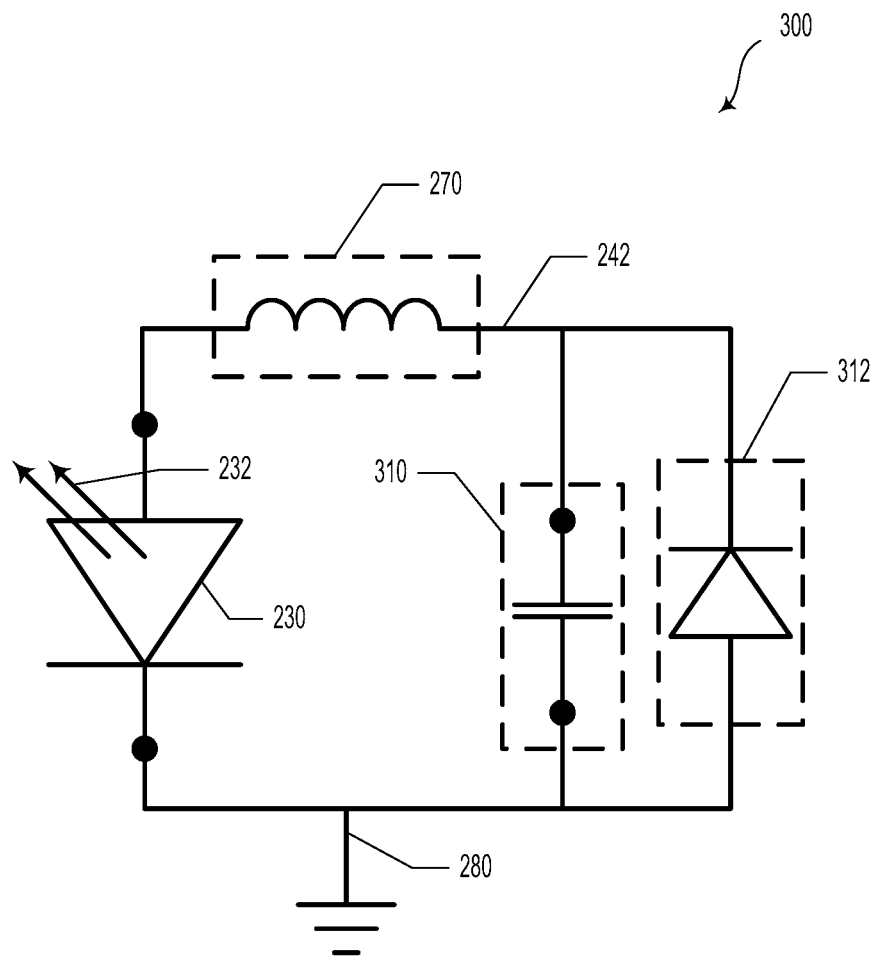
FIG. 3 illustrates a lumped circuit, according to an example embodiment.

FIG. 3 illustrates a lumped circuit 300, according to an example embodiment. The elements of lumped circuit 300 may be lumped circuit model representations of various elements of circuits 200 and 290, as illustrated and described with regard to FIGS. 2A and 2B, respectively. For example, lumped circuit 300 may be a schematic representation of the circuit 200 while first FET 220 is "on" and the laser diode 230 is emitting light 232. In such a scenario, the lumped circuit 300 may include a parasitic inductance 270, a characteristic capacitance 310, and a characteristic body diode 312. The characteristic capacitance 310 may be based on the second FET 260. In such scenarios, the energy stored in the characteristic capacitance 320 may provide current to the laser diode during the nanosecond time scale of the pulse width. The power supply may recharge the characteristic capacitance 320 over a much slower time scale. The value of characteristic capacitance 310 may vary, based on, for example, the voltage across the laser diode 230. In some embodiments, a combination of the parasitic inductance 270 and the characteristic capacitance 310 may provide a RLC circuit configured to provide sub-2.5 nanosecond laser pulse widths. As such, the charge within the lumped circuit 300 may "free-wheel" rather than oscillate within the circuit.

Furthermore, after the initial pulse and once the current through the laser diode starts to decrease, the second FET 260 may include a characteristic body diode 312 that may prevent a drain-to-source voltage inversion. By preventing such a voltage inversion, ringing may be reduced or eliminated. In other words, the second FET 260 may reduce or eliminate the development of a negative voltage between the supply voltage 242 and ground when switching the first FET at high speed.

As such, the second FET 260 and its associated characteristic capacitance 310 and characteristic body diode 312 may reduce or eliminate ringing associated with driving the first FET 220 and the laser diode 230 at short pulse widths and/or at a high repetition rates.

While second field effect transistor 124 and second FET 260 are characterized as field effect transistors, it will be understood that another electrical device with the same characteristics of second field effect transistor 124 and second FET 260 could be substituted within the scope of the present disclosure. That is, another type of circuit element, such as a p-n diode, a Schottky diode, a flyback diode, or a freewheeling diode, among other possibilities, may be used in place of second field effect transistor 124 or second FET 260 to reduce or eliminate ringing in laser pulser circuits.

Figure 4:
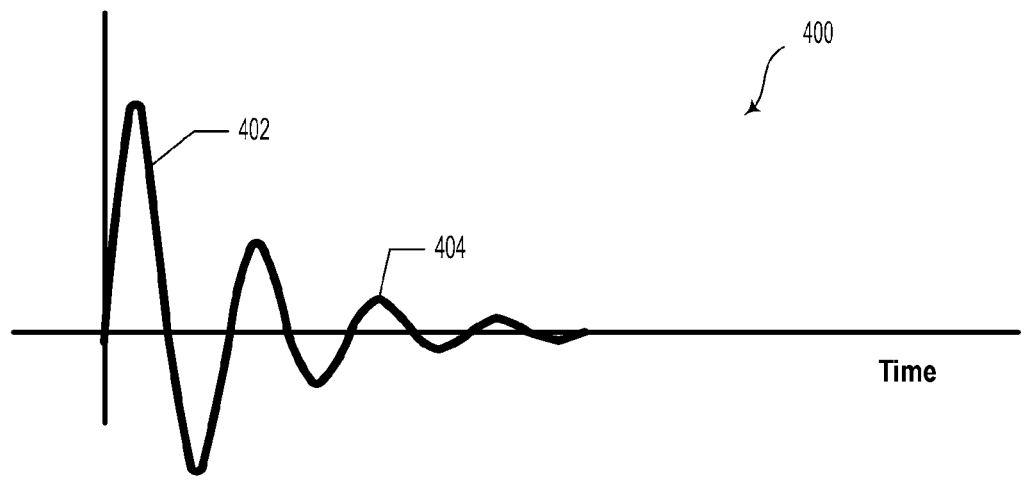
FIG. 4 illustrates voltage waveforms, according to example embodiments.
Figure 4:
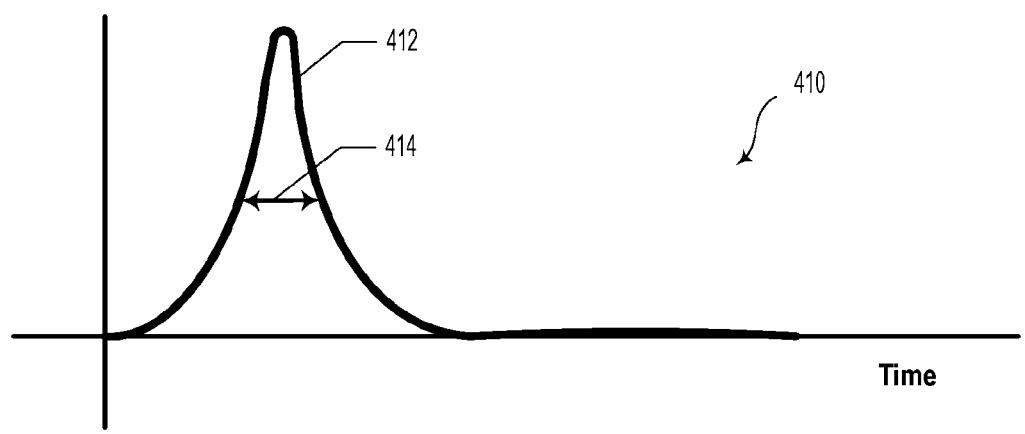

FIG. 4 illustrates voltage waveforms 400 and 410, according to example embodiments. Namely, voltage waveforms 400 and 410 may represent a voltage across the laser diode 230 during a single laser pulse operation without, and with, the second FET 260, respectively.

For instance, voltage waveform 400 may relate to an example in which circuit 200 does not include the second FET 260. In such a scenario, waveform 400 includes a desired pulse 402 but may also include ringing oscillations 404. Such oscillations 404 may reduce the operating lifetime of the laser diode 230, cause unwanted laser light emission, and/or limit a maximum possible laser repetition rate.

The inclusion of the second FET 260 into the circuit 200 may provide better device operation characteristics. For example, a laser pulse 412 may have a full-width half maximum (FWHM) 414 of less than 2.5 nanoseconds. It is understood that a laser pulse width may be measured in other ways (e.g., 10%=rising edge, 90%=falling edge, etc.). Furthermore, voltage waveform 410 may exhibit reduced or eliminated ringing oscillations. As such, the laser diode 230 may have a longer operating lifetime, unwanted laser light emission may be reduced, and the maximum possible laser repetition rate may be increased compared to the scenario without the second FET 260.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A system comprising:
   a trigger source;
   a laser diode;
   a first field effect transistor, wherein the laser diode is coupled to a supply voltage and a drain terminal of the first field effect transistor, wherein a source terminal of the first field effect transistor is coupled to ground, wherein a gate terminal of the first field effect transistor is coupled to the trigger source; and
   a second field effect transistor, wherein a drain terminal of the second field effect transistor is coupled to the supply voltage, wherein a source terminal of the second field effect transistor and a gate terminal of the second field effect transistor are coupled to ground.

2. The system according to claim 1, further comprising a controller, wherein the controller comprises at least one processor and a memory, wherein the at least one processor executes instructions stored in the memory so as to carry out operations.

3. The system according to claim 2, wherein the operations comprise causing the trigger source to provide a trigger pulse signal so as to cause the laser diode to emit a laser pulse.

4. The system according to claim 3, wherein the laser pulse comprises a pulse width of less than 2.5 nanoseconds.

5. The system according to claim 1, wherein the first field effect transistor and the second field effect transistor comprise gallium nitride (GaN).

6. The system according to claim 1, wherein the first field effect transistor and the second field effect transistor comprise silicon carbide (SiC).

7. The system according to claim 1, wherein at least one of the first field effect transistor or the second field effect transistor comprise a surface-mount device.

8. The system according to claim 1, wherein the supply voltage is greater than 100 volts.

9. The system according to claim 1, wherein at least one of the first field effect transistor or the second field effect transistor comprises a high electron mobility transistor (HEMT).

10. The system according to claim 1, wherein the second field effect transistor is configured to reduce oscillations in the system.

11. The system according to claim 1, wherein the second field effect transistor is configured to reduce or eliminate a negative voltage between a drain terminal and a source terminal of the first field effect transistor.

12. The system according to claim 1, further comprising a return diode connected between the drain terminal of the first field effect transistor and the supply voltage.

13. A circuit comprising:
    a laser diode;
    a first field effect transistor, wherein the laser diode is coupled to a supply voltage and a drain terminal of the first field effect transistor, wherein a source terminal of the first field effect transistor is coupled to ground; and
    a second field effect transistor, wherein a drain terminal of the second field effect transistor is coupled to the supply voltage, wherein a source terminal of the second field effect transistor and a gate terminal of the second field effect transistor are coupled to ground.

14. The circuit of claim 13, wherein at least one of the first field effect transistor or the second field effect transistor comprises a high electron mobility transistor (HEMT).

15. The circuit of claim 13, wherein at least one of the first field effect transistor or the second field effect transistor comprises a high-speed high-power transistor.

16. The circuit of claim 13, wherein the supply voltage is greater than 100 volts.

17. The circuit of claim 13, further comprising a trigger source coupled to a gate terminal of the first field effect transistor.

18. The circuit of claim 17, wherein the trigger source is operable to provide a trigger pulse so as to cause the laser diode to emit a laser light pulse.

19. The circuit of claim 18, wherein the laser light pulse has a pulse width of less than 2.5 nanoseconds.

20. The circuit of claim 17, wherein the trigger source is operable to provide a pulse train of trigger pulses so as to cause the laser diode to emit a laser pulse train of laser light pulses, wherein each laser pulse has a pulse width of less than 2.5 nanoseconds.

* * * * *